United States Patent [19]

Blanchet-Fincher et al.

[11] Patent Number: 5,268,354

[45] Date of Patent: Dec. 7, 1993

[54] PROCESS FOR MAKING SUPERCONDUCTING TL-PB-SR-CA-CU-O FILMS

[75] Inventors: Graciela B. Blanchet-Fincher; Curtis R. Fincher, Jr., both of Wilmington; Norman Herron, Newark, all of Del.

[73] Assignee: E. I. Du Pont de Nemours and Comapny, Wilmington, Del.

[21] Appl. No.: 855,383

[22] Filed: Mar. 20, 1992

[51] Int. Cl.$^5$ .................. B05D 3/06; B05D 3/02; B05D 5/12

[52] U.S. Cl. .................. 505/1; 505/732; 505/737; 505/742; 427/62; 427/226; 427/596

[58] Field of Search .................. 505/1, 732, 730, 742, 505/737; 427/62, 63, 53.1, 314, 226, 596

[56] References Cited

U.S. PATENT DOCUMENTS 4,894,361  1/1990  Subramanian .................. 505/1

OTHER PUBLICATIONS

Subramanian et al, "Bulk Superconductivity Up to 122K in the Tl-Pb-Sr-Ca-Cu-O System", Science, vol. 242, Oct. 1988, p. 249.
Shah et al, "Fabrication of Tl-Ba-Ca-Cu-O Films by Annealing rf-Sputtered Ba-Ca-Cu-O Films in Thallium Oxide Vapors", Appl. Phya Lett. 56(8) Feb. 1990 pp. 782-784.
Moodera et al, "In Situ Deposition of Superconducting Bi-Pb-Sr-Ca-Cu-O Thin Films on MgO(100) Substrates by rf Magnetron Sputtering and Laser Ablation" Appl. Phys. Lett. 57(23) Dec. 1990 pp. 2498-2500.
Gupta et al, "$Y_1Ba_2Cu_2O_{7-\delta}$ Thin Films Grown by a Simple Spray Depositoin Technique", Appl. Phys. Lett. 52(2) Jan. 1988 pp. 163-165.
Lee et al, "Superconducting Tl-Ca-Ba-Cu-O Thin Films with Zero Resistance at Temperatures of up to 120K", Appl. Phys. Lett. 53(4) Jul. 1988 pp. 329-331.
Krebs et al, "Conditions for Oriented Growth of Y-Ba-Cu-O and Bi-Sr-Ca-Cu-O Films by Pulsed Laser Ablation", J. Appl. Phys. 69(4) Feb. 1991 pp. 2405-2409.
Nobumasa et al, "Formation of a 100K Superconducting Bi(Pb)-Sr-Ca-Cu-O Film by a Spray Pyrolysis", Jpn. J. Appl. Phys. 27(9) Sep. 1988 pp. L1669-L1671.

*Primary Examiner*—Roy King

[57] ABSTRACT

A process making thin film elements of an oxide superconductor $(Tl_{.5}Pb_{0.5})Sr_2CaCu_2O_7$, $(Tl_{.5}Pb_{0.5})Sr_2Ca_2Cu_3O_9$ or a mixture thereof. The process entails forming an oxide film of a mixture of oxides of Pb, Sr, Ca and Cu in preselected amounts, placing the oxide film in a container of nonreactive metal such as gold that contains a powder of $(Tl_{.5}Pb_{0.5})Sr_2Ca_2Cu_3O_9$ superconductor, sealing the container, and heating the sealed container to a temperature of about 820° C. to about 950° C. for at least 1 minute.

14 Claims, 7 Drawing Sheets

PROCESS FOR MAKING SUPERCONDUCTING TL-PB-SR-CA-CU-O FILMS

FIELD OF THE INVENTION

This invention relates to manufacture of high temperature superconductor oxide thin films which can be used as such, or patterned for use as circuit elements.

BACKGROUND OF THE INVENTION

Recent advances in the superconducting transition temperature of various oxide materials has provided the opportunity for applications in radio frequency, microwave and other electronic technologies. Considerable progress has been made in a number of fabrication technologies related to forming these oxide superconductors into various electronic devices. The higher the transition temperature of the superconducting oxide the more likely that material will be of value in such applications. Subramanian, U.S. Pat. No. 4,894,361, and Subramanian et al., Science 242, 249 (1988) disclose superconducting compositions of Tl-Pb-Sr-Ca-Cu-O. Two superconducting phases were identified. One phase has a c-axis unit cell dimension of about 12 Angstroms (1.2 nm) and a superconductivity transition temperature $T_c$ of about 85° K., and the other phase has a c-axis unit cell of about 15 Angstroms (1.5 nm) and a $T_c$ of about 122° K. Methods for producing powders of these materials and single crystals of the higher $T_c$ material are also disclosed.

For most present electronic device applications such as radio frequency and microwave technology, thin films are proving to be the form of superconducting oxide most useful. As a result, much of the work relating to the use of high temperature superconductors in microelectronic applications has focused on the growth of high quality thin films. Such films can serve as ground planes or can be patterned into a microwave circuit. High quality superconducting films can have significantly lower values of surface resistance than copper or gold films. This low surface resistance is important for making high-performance thin film microwave circuits such as filters, resonators and delay lines.

Although the methods of the prior art have achieved quality films, the need exists for further, high quality films. The process of this invention provides high quality superconducting films that include superconducting compositions of Tl-Pb-Sr-Ca-Cu-O. These films are useful as circuit elements.

SUMMARY OF THE INVENTION

This invention provides a process for making a superconducting thin film element formed of $(Tl_{.5}Pb_{0.5})Sr_2CaCu_2O_7$, $(Tl_{.5}Pb_{0.5})Sr_2Ca_2Cu_3O_9$ or a mixture thereof. This process entails forming on a suitable substrate an oxide film of a mixture of oxides of Pb, Sr, Ca and Cu with the atomic ratio of Pb:Sr:Ca:Cu of a:m:n:p wherein a is from 0 to 5/4, m=2, n is from 1 to 2 and p is from 2 to 3.5. The film may be formed by spraying an aerosol formed from a solution of nitrates of Pb, Sr, Ca and Cu with the above-mentioned atomic ratio of Pb:Sr:Ca:Cu of a:m:n:p onto the substrate, and pyrolizing the nitrates to oxides either during deposition or subsequent to deposition. Alternatively, the superconducting film element may be formed by depositing an amorphous mixture of oxides of Pb, Sr, Ca and Cu formed from a solid pellet of the oxides with the above-mentioned atomic ratio of Pb:Sr:Ca:Cu of a:m:n:p onto the substrate by laser ablation of the pellet of oxides.

The substrate bearing the oxide film is placed into a container of nonreactive metal such as gold together with a powder of $(Tl_{.5}Pb_{0.5})Sr_2Ca_2Cu_3O_9$ superconductor. The amount of $(Tl_{.5}Pb_{0.5})Sr_2Ca_2Cu_3O_9$ powder is at least 100 times the weight of the oxide film. The container is sealed and is heated to 820° C. to 950° C., preferably 860° C. to 910° C. The temperature is maintained for at least 1 minute, preferably for 2 to 12 hours, and reduced to 600° C. to 750° C. over 15 minutes to 12 hours. This temperature is maintained for 1 to 24 hours, whereafter the temperature is reduced to ambient temperature over 2 to 18 hours to yield the superconductor film on the substrate.

When the oxide film is prepared by spraying an aerosol formed from a solution of nitrates of Pb, Sr, Ca and Cu, the oxide film can be formed during deposition by heating the substrate to a temperature above the decomposition temperature of the nitrates. Preferably, the oxide film is formed subsequent to deposition by heating the nitrate film to 550° C. to 900° C., preferably 600° C., in an argon atmosphere. This temperature is maintained for 1 to 60 minutes and then reduced to ambient temperature over 2 to 12 hours. Preferably, the oxide film is prepared by multiple depositions with intermediate heatings to convert the nitrates to oxides.

When the oxide film is prepared by depositing an amorphous mixture of oxides of Pb, Sr, Ca and Cu by means of laser ablation, the substrate is maintained during the deposition at a temperature ranging from ambient to 600° C., preferably from 450° C. to 600° C.

DETAILED DESCRIPTION OF THE INVENTION

Figure 1:
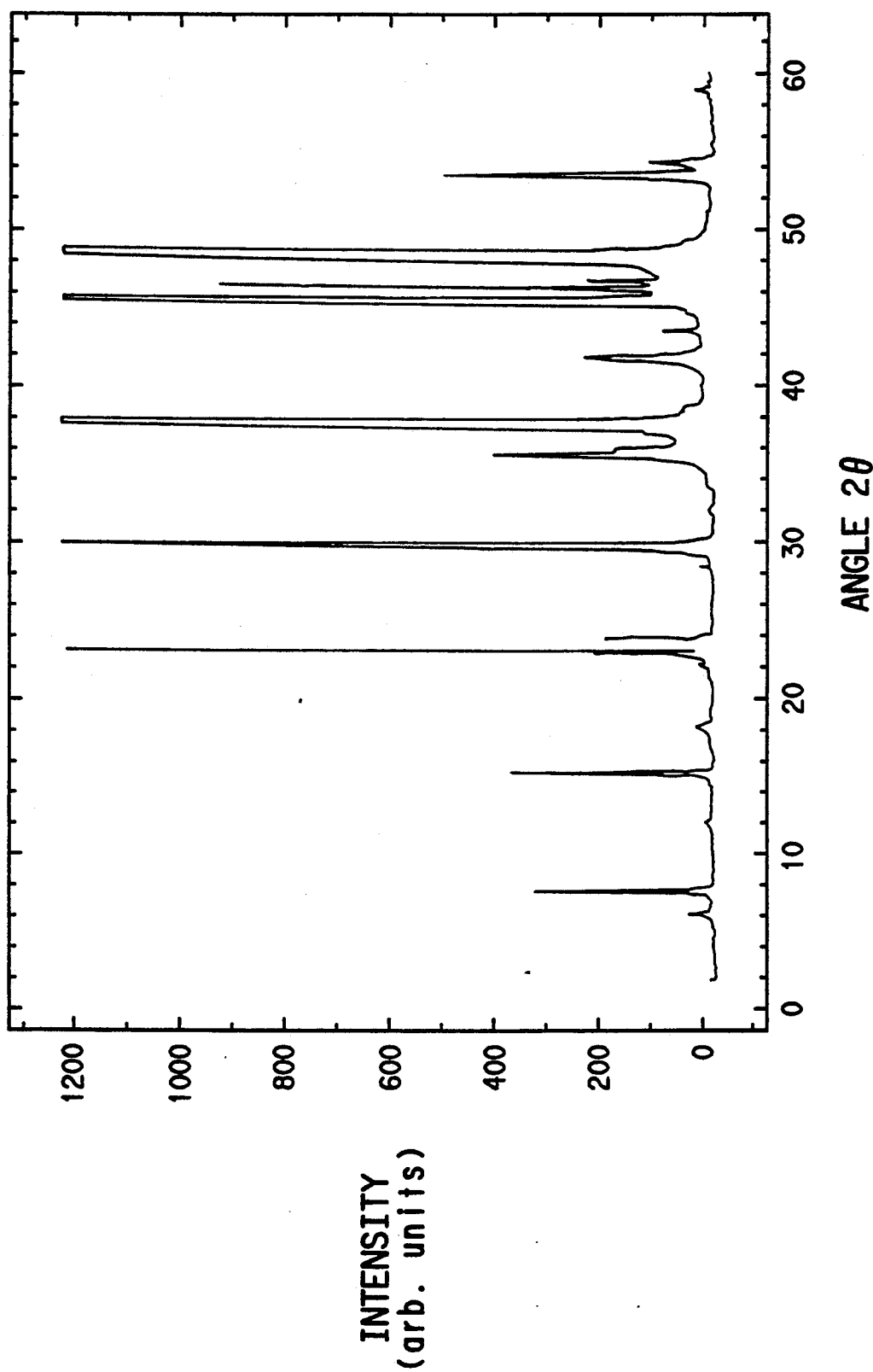
FIG. 1 shows the X-ray diffraction pattern for the film of Example 2.

Having briefly summarized the invention, the invention will now be described in detail by reference to the following specification and non-limiting examples. Unless otherwise specified, all percentages are by weight.

This invention provides a process for making a circuit element comprised of an oxide superconductor film. The oxide superconductor is $(Tl_{.5}Pb_{0.5})Sr_2CaCu_2O_7$, $(Tl_{.5}Pb_{0.5})Sr_2Ca_2Cu_3O_9$ or a mixture thereof. There can be some variation of the 1:1 atomic ratio of Tl:Pb and the other atomic ratios indicated by the formulas given above and the resulting films will still exhibit good superconducting properties. The films produced by the process of this invention typically show superconductivity with zero resistance above 77° K., and when prepared under preferred conditions, have zero resistance above 100° K. Elements of these films can serve as circuit connections, as the element of a circuit device as in a Josephson junction, or as a thin superconducting film.

The process of this invention entails forming on a suitable substrate an oxide film of a mixture of oxides of Pb, Sr, Ca and Cu with the atomic ratio of Pb:Sr:Ca:Cu of a:m:n:p wherein a is from 0 to about 5/4, m=2, n is from 1 to 2 and p is from 2 to 3.5. This oxide film can be formed in several ways. In a first embodiment, an aerosol formed from a solution of nitrates of Pb, Sr, Ca and Cu with the atomic ratio of Pb:Sr:Ca:Cu of a:m:n:p is sprayed onto the substrate.

The nitrate solution of the aerosol contains nitrates of Pb, Sr, Ca and Cu in a solvent, preferably water. The nitrate solution can be prepared by starting with the appropriate nitrate salts. Alternatively, the nitrate solution can be prepared by reacting oxides or hydroxides of Pb, Sr, Ca and Cu with sufficient concentrated nitric acid to convert the metals present to metal nitrates. Excess nitric acid can be used to speed the reaction. The aerosol can be formed from the solution of nitrates using a compressed gas such as $N_2$ or $O_2$ as the carrier.

The aerosol is sprayed onto a substrate to produce a uniform fine-grained film of the nitrates or of the oxides. Spraying, when employing a standard aerosol nozzle, typically employs 10 liters per minute of the carrier gas mixed with 1 ml per minute of the nitrate solution. Typically, concentration of the nitrate solution in the carrier is from 0.5 wt % to 10 wt %. For convenience, spraying of the aerosol, as provided in the examples below, is performed by distributing the aerosol over an area of approximately 100 $cm^2$. With this area and the deposition conditions used, a nitrate film thickness of 2 to 50 mm typically is produced. This film thickness is reduced during heating, and the thickness of the film of the final superconductor oxide element is thinner than the nitrate film by a factor in the range from about 6 to about 7. This reduction in thickness must be allowed for obtaining the desired thickness of the superconducting film element. Generally, as the ratio of the gas to liquid in the aerosol is raised by decreasing the liquid flow rate or by increasing the gas velocity at the nozzle, a finer aerosol is formed and a superior element results. The aerosol can also be formed by ultrasonic nebulization. Ultrasonic nebulization allows even tighter control of the droplet size distribution and hence more control over deposition.

To form a nitrate film on the substrate the substrate is heated during spraying to a temperature above the boiling point of the solvent, preferably more than 20 Centigrade degrees above the boiling point, but below the decomposition temperature of the nitrates, preferably more than 100 Centigrade degrees below the decomposition temperature. The substrate is typically heated to about 120° C. to about 180° C. To directly form an oxide film on the substrate, the substrate is heated during spraying to a temperature above the decomposition temperature of the nitrates. The decomposition of the nitrates deposited and the properties of the resulting oxide films are affected by the carrier gas. The use of $O_2$ as the carrier gas results in the incorporation of an appreciable amount of oxygen into the oxide film formed on the substrate. Incorporation of the oxygen into the film can lower the subsequently employed heating temperatures to lessen the degree of interaction with the substrate during the heating. A higher decomposition temperature results in more interaction during deposition.

When spray deposition is used, the oxide film preferably is formed subsequent to deposition by heating the nitrate film to 550° C. to 900° C., preferably 600° C., in an argon atmosphere, maintaining this temperature for 1 to 60 minutes, and reducing the temperature to ambient temperature over 2 to 12 hours. The resulting film can be sintered at from 700° C. to 900° C. in flowing oxygen for from 5 to 15 minutes to insure complete pyrolysis of the nitrates to oxides. Preferably, the oxide film is prepared by multiple depositions with intermediate heatings to convert the nitrates to oxides.

An alternative embodiment for forming the oxide film is by laser ablation of a ceramic pellet of the oxides of Pb, Sr, Ca and Cu. The ceramic pellet used for the ablation target is prepared by mixing oxides of Pb, Sr, Ca and Cu in the atomic ratio of Pb:Sr:Ca:Cu of a:m:n:p, wherein a is from 0 to 5/4, m =2, n is from 1 to 2 and p is from 2 to 3.5. The resulting mixture is calcined at 600° C. to 800° C. for 1 to 12 hours, ground, and refired under the conditions just described. The resulting material is reground, and pressed into a target disk of about 1 cm diameter and 3 mm thick. This disk is sintered at 700° C. to 800° C. for 1 to 3 hours. The target disk is placed in a vacuum chamber approximately 3 cm from the substrate upon which the film is to be deposited. The laser beam of a YAG laser, such as a Spectra Physics DCR-11 1064 nm wavelength laser or an eximer, for example a Lamda-Physic EMG-201 248 nm wavelength eximer, then is focused onto the target disk with a fluence of 1-8 Joules/$cm^2$-pulse. The impingement of the laser beam on the disk results in immediate melting and expulsion of material from the target that is deposited on the substrate at the rate of 0.1-1 Å (0.01-0.1 nm)/pulse. The substrate is maintained at a temperature in the range of ambient up to 600° C., preferably from 450° C. to 600° C., in an $O_2$ atmosphere of 10-200 mtorr (1.3-26 Pa).

The properties of the oxide films formed by laser ablation can be varied by changing the substrate temperature. Deposition onto the substrate at ambient temperature results in an amorphous film of the desired stoichiometry, while deposition onto a substrate heated to very high temperatures (>700° C.) yields films which are a mixture of the crystalline phases of the oxides. Deposition preferably is done above 450° C. to achieve a film which will maintain a good contiguous morphology during the subsequent heating of the film over the range of 820° C. to 950° C. Deposition is performed below 600° C. to avoid formation of $CaPbO_3$ that inhibits formation of superconducting material. The ablated material is deposited to provide a film of 1000 to 20,000 Å (100 nm 0 to 2 μm).

Substrates useful in the present invention are compatible with formation of the oxide superconductor. Preferred substrates are MgO, $LaAlO_3$, $SrTiO_3$ and yttria-stabilized zirconia (YSZ).

This invention also provides for thallination of the oxide film. By thallination herein is meant the diffusion of Tl and, depending on the Pb content of the film, Pb into the oxide film to achieve the desired stoichiometry of those metals in the oxide film. Thallination is accomplished by placing the substrate on which the oxide film has been formed into a container of nonreactive metal, such as gold, that contains a powder of $(Tl_{.5}Pb_{0.5})Sr_2Ca_2Cu_3O_9$. The amount of $(Tl.5Pb_{0.5})Sr_2Ca_2Cu_3O_9$ powder in the container is at least 100 times the weight of the oxide film. The container is sealed, and heated to 820° C. to 950° C., preferably 860° C. to 910° C. This temperature is maintained for at least 1 minute, preferably for 2 to 12 hours.

Thallination can be performed above 820° C. to yield superconducting films, but preferably is done below 950° C. to maintain morphology of the film and to prevent reaction with the substrate. The length of time of thallination can range from 1 minute at higher temperatures to 12 hours or more at lower temperatures.

Typically, the oxide film and 100 mg of $Tl_{0.5}Pb_{0.5}Sr_2Ca_2Cu_3O_9$ powder are placed into a gold tube that is tightly sealed by crimping which results in a cold weld in the end of the tube or by fusing. The sealed tube is placed in an $Al_2O_3$ boat and placed in a furnace preheated to 820° to 950° C. The temperature is maintained at 820° to 950° C. for 1 minute to 12 hours and cooled to 720° C. during a period of about 30 minutes to about 2 hours. The temperature is maintained at 720° C. for a time of 4 to 12 hours, and slowly cooled to ambient at a rate of approximately 10° C./min The superconducting film produced by this invention can be fabricated into devices such as resonators, delay lines, filters and other passive devices. The superconducting film also can be combined with semiconductor materials to produce active devices. Devices can be designed into microstrip, stripline and coplanar arrangements. Depending upon use, the superconducting film can be used directly in a circuit device, or alternatively, can be patterned.

Patterning the superconducting film is performed by depositing a photohardenable polymer onto the oxide film. The thickness of the photohardenable polymer film is from 1 $\mu$m to 20 $\mu$m. The deposited, photohardenable polymer is exposed imagewise to radiation capable of hardening the polymer. If the photohardenable polymer is a negative resist type, the exposed (hardened) polymer constitutes the desired pattern of the oxide superconductor. Subsequent to exposure to radiation, the photohardenable polymer is contacted with a solvent to selectively remove those portions of the polymer film that have not been hardened by radiation to expose the oxide film where oxide superconductor is not wanted. The exposed oxide film is removed with solvent.

If the photohardenable polymer is a positive resist type, the unexposed polymer forms the desired pattern of the oxide superconductor film. The exposed polymer is contacted with a solvent to selectively remove those portions of the polymer film that is hardened by radiation to expose the oxide film in those region where oxide superconductor is not wanted. The exposed oxide film is removed with solvent.

High quality, high resolution (5 $\mu$m wide lines) in the patterned film can be obtained by using positive resist photohardenable polymers. Examples of these polymers include AZ5214-E, a propylene glycol monomethyl ether acetate cresol novolak resin from American Hoescht Corporation. Another positive resist used is KTI 820 from KTI Chemicals Incorporated. Both of these positive resist polymers are developed in basic solutions. A suitable basic solution includes one part of sodium hydroxide in 80 parts $H_2O$, and one part of potassium hydroxide in 80 parts of $H_2O$. The resist is developed for 1 minute in a first bath of the basic solution, for minutes in a second bath of the basic solution, and rinsed in water.

Reactive ion beam etching, as is well known, also can be used to pattern the superconducting films to obtain very fine line widths and excellent feature definition.

Without further elaboration, it is believed that one skilled in the art can, using the preceding description, utilize the present invention to its fullest extent. The following preferred specific embodiments are, therefore, to be construed as merely illustrative, and not limiting of the disclosure in any way whatsoever. The superconductivity transition temperature $T_c$ reported in the following Examples is the temperature at which the resistance becomes zero. Resistances were measured using the standard four-probe method.

EXAMPLES 1-6

These Examples show that films with high $T_c$'s can be obtained from various combinations of thallination temperatures and times.

An aqueous solution of the nitrates of lead, strontium, calcium and copper in concentrations of 0.99%, 0.84%, 1.07% and 1.05% respectively is prepared with an atomic ratio of Pb:Sr:Ca:Cu of 0.5:2:2:3.2. An aerosol is formed from this solution using an air brush. The aerosol is deposited onto a substrate of polished MgO single crystal cleaved to provide a (100) surface.

The substrates are maintained at 140° C. during deposition of the nitrate film from the aerosol. The solution is delivered to the air brush in four individual 20 ml aliquots which is deposited on the substrate. Following deposition of each aliquot, the deposited nitrate films on the substrates are heated to 600° C. in an argon atmosphere for 10 minutes. After completion of these four depositions and heatings, the films then are sintered at 900° C. in a furnace with pure oxygen flowing at 4L/min. through the furnace. The films are held at 900° C. for 5 minutes and cooled at 70° C./min in flowing oxygen to ambient temperature, about 20° C. Each of the resultant films are placed in individual gold tubes filled with 100 mg of powder of $(Tl_{0.5}Pb_{0.5})Sr_2Ca_2Cu_3O_9$ superconductor. The ends of the tubes are fused to seal the tubes, and the sealed tubes are then placed in an alumina boat. The alumina boat bearing the sealed tubes was placed into a furnace heated to the desired thallination temperature. The thallination temperature and the time for which the temperature are maintained are indicated in Table 1.

Figure 2:
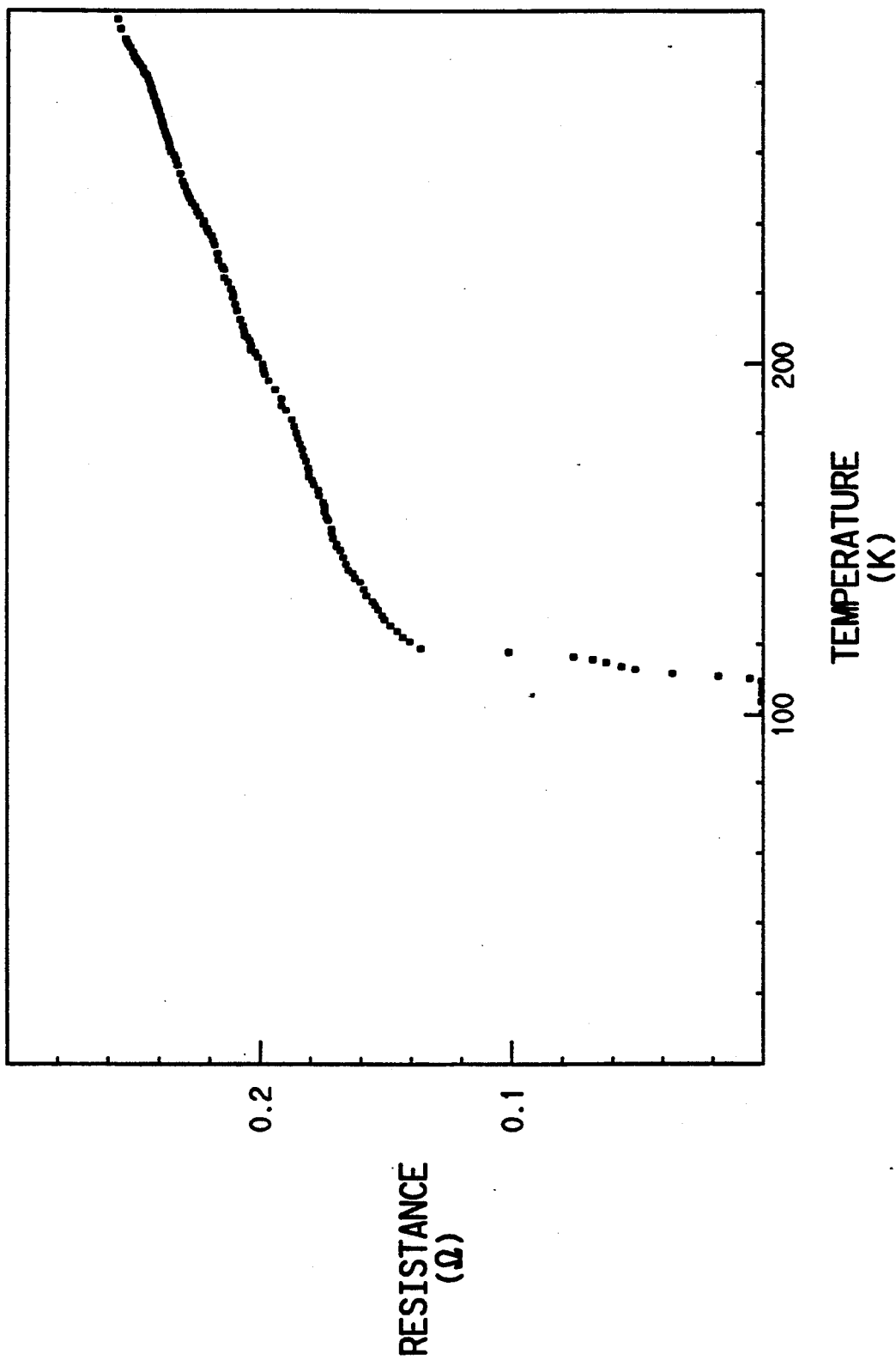
FIG. 2 shows electrical resistance as a function of temperature for the film of Example 2.

At the completion of this heating, the tube is cooled to 720° C. over 2 hours, held at 720° C. for 4 hours, and rapidly cooled to ambient temperature. The films are removed from the tubes and characterized by X-ray diffraction and resistivity measurements. Table 1 shows the critical temperature ($T_c$), the temperature at which zero resistance is observed, and the effect of thallination temperature on Tο. FIGS. 1 and 2 show the X-ray diffraction pattern and the resistance as a function of temperature for the film of Example 2. Example 2 shows a superconductivity transition onset at

TABLE 1

| Example No. | Thallination Temp. (°C.) | Time (hr) | $T_c$(K) |
|---|---|---|---|
| 1 | 870 | 12 | 104.6 |
| 2 | 880 | 12 | 108 |
| 3 | 890 | 8 | 103 |
| 4 | 900 | 8 | 103 |
| 5 | 915 | 4 | 103.9 |
| 6 | 925 | 1 | 99 |

EXAMPLES 7-10

In examples 7-10, a 2% aqueous solution of the nitrates of lead, strontium, calcium and copper is prepared with an atomic ratio of Pb:Sr:Ca:Cu of 0.5:2:2:3. An aerosol of the solution is formed by using an air brush. The aqueous solution of nitrates is delivered in four individual 20 ml aliquots and deposited onto a polished MgO single crystal substrate cleaved to provide a (100) surface. The substrates are held at 140° C. during deposition of the nitrate film. Following each deposition of aerosol, the film on the substrate is heated to 600° C. in an argon atmosphere for 10 minutes. After these four depositions and heatings, the films of Examples 8, 9 and 10 are placed into a furnace at the sintering temperature indicated in Table 2 with pure oxygen flowing at 4L/min through the furnace. The films are held at this temperature for 15 minutes and cooled at 70° C./min in flowing oxygen to ambient temperature, about 20° C.

The films of each of these examples are thallinated by the following procedure: The film is placed in a gold tube with 100 mg of $Tl_{0.5}Pb_{0.5}Sr_2Ca_2Cu_3O_9$ powder. The ends of the tube are fused to seal the tube, and the sealed tubes are placed in an alumina boat. The alumina boat bearing the sealed tubes is placed into a furnace which is at a temperature of 880° C. The film is held at 880° C. for 4 hours and cooled to 720° C. at 1.33° C./min. The sample is held at 720° C. for 4 hours and cooled at 1° C./min to ambient temperature, about 20° C.

Figure 3:
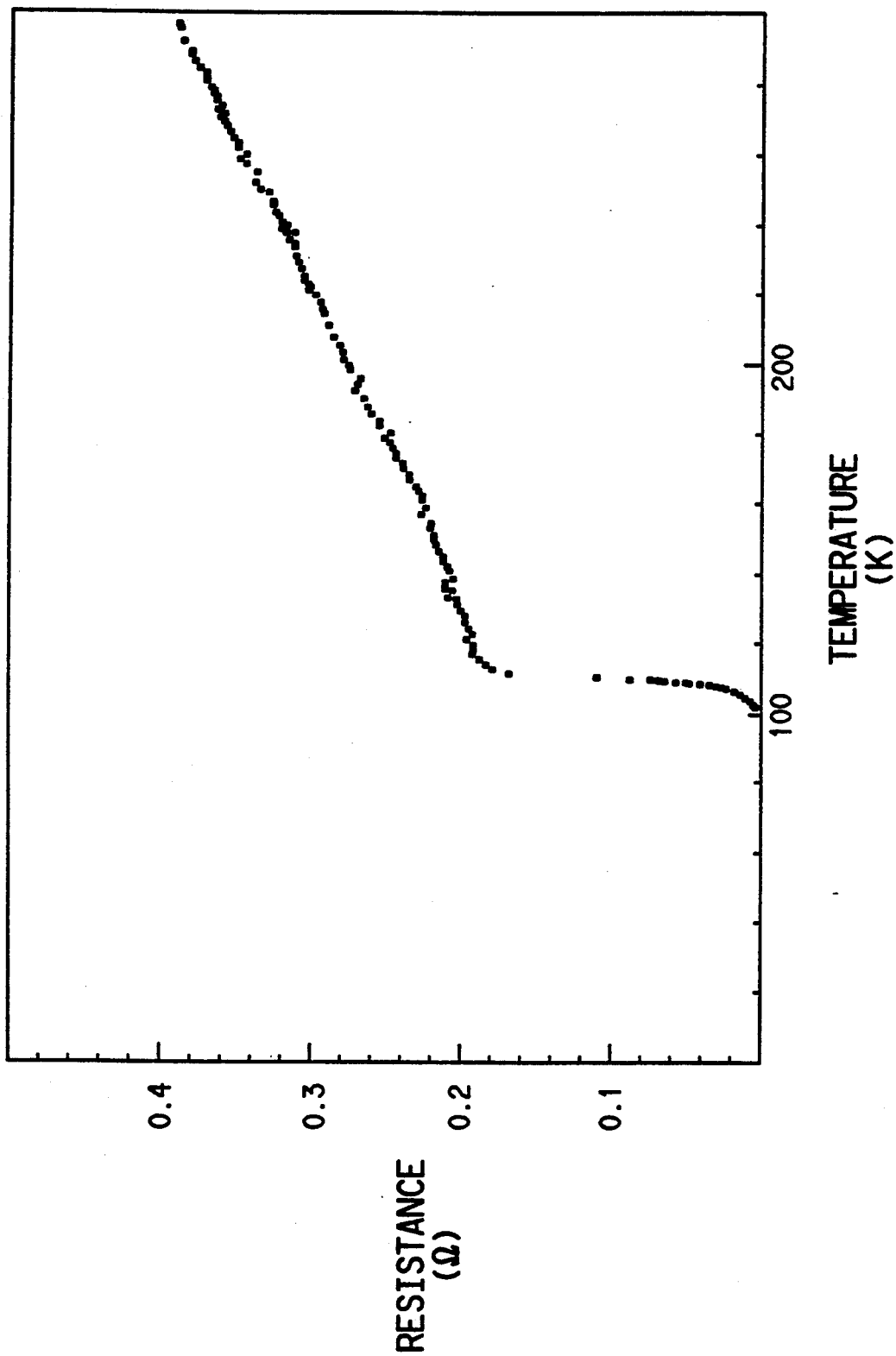
FIG. 3 shows electrical resistance as a function of temperature for the film of Example 9.

Measurement of resistance as a function of temperature, as shown in FIG. 3, indicates that the film of Example 9 has a superconductivity transition onset at 120° K. and a zero resistance at 103° K.

TABLE 2

| Example No. | Sintering Temp. (°C.) | $T_c$(K) |
| --- | --- | --- |
| 7 | — | 35 |
| 8 | 700 | 83.2 |
| 9 | 800 | 103 |
| 10 | 900 | 52.4 |

EXAMPLE 11

This example shows that a film which is nearly completely single phase can be produced.

The thin oxide film of this example is deposited by ablating a bulk, non-superconducting target of $Pb_{0.5}Sr_2Ca_2Cu_3O_x$ with subsequent diffusion of thallium at elevated temperatures. The ablation target is prepared from quantities of oxides of Pb, Sr, Ca and Cu. These quantities are chosen so that the atomic ratio of Pb:Sr:Ca:Cu is 0.5:2:2:3. These oxide powders are mixed, fired at 800° C. for 12 hours in air, and reground several times to assure homogeneity. The resulting powder is pressed into a pellet about 2 cm in diameter and 3 mm thick. This pellet is sintered at 800° C. for 1 hour to provide the ablation target.

Laser ablation is performed in a vacuum chamber maintained at a background pressure of $10^{-6}$ torr ($1.3 \times 10^{-4}$ Pa). The chamber is equipped with sapphire windows to permit the laser beam to strike the sample at a 45° angle. The target is ablated with the 532 nm second harmonic line of a Spectra-Physics DCR-11 Nd-YAG laser. The second harmonic line is separated from the fundamental by a pair of dichroic mirrors at 45° incidence placed immediately outside the laser cavity. The beam is directed into the chamber by plane mirrors and focussed onto a 1 mm² spot size by a lens placed at the entrance of the vacuum chamber. Uniform coverage of the substrate is assured by rastering the laser beam onto the target with a set of motorized micrometers placed on the last plane mirror. The fluence of the laser beam is 20 J/cm² in a 6–7 nanosecond pulse. The thin film is deposited onto polished MgO (100) substrate. The substrate temperature during deposition is 540° C. and the deposition time is 45 minutes. The oxygen pressure is maintained at 100 mtorr (13 Pa) during the deposition. Following deposition, oxygen is bled into the chamber while maintaining the sample temperature at 540° C. When atmospheric pressure is reached the sample is cooled to room temperature, about 20° C. The thickness of the deposited film is 1 μm.

Figure 4:
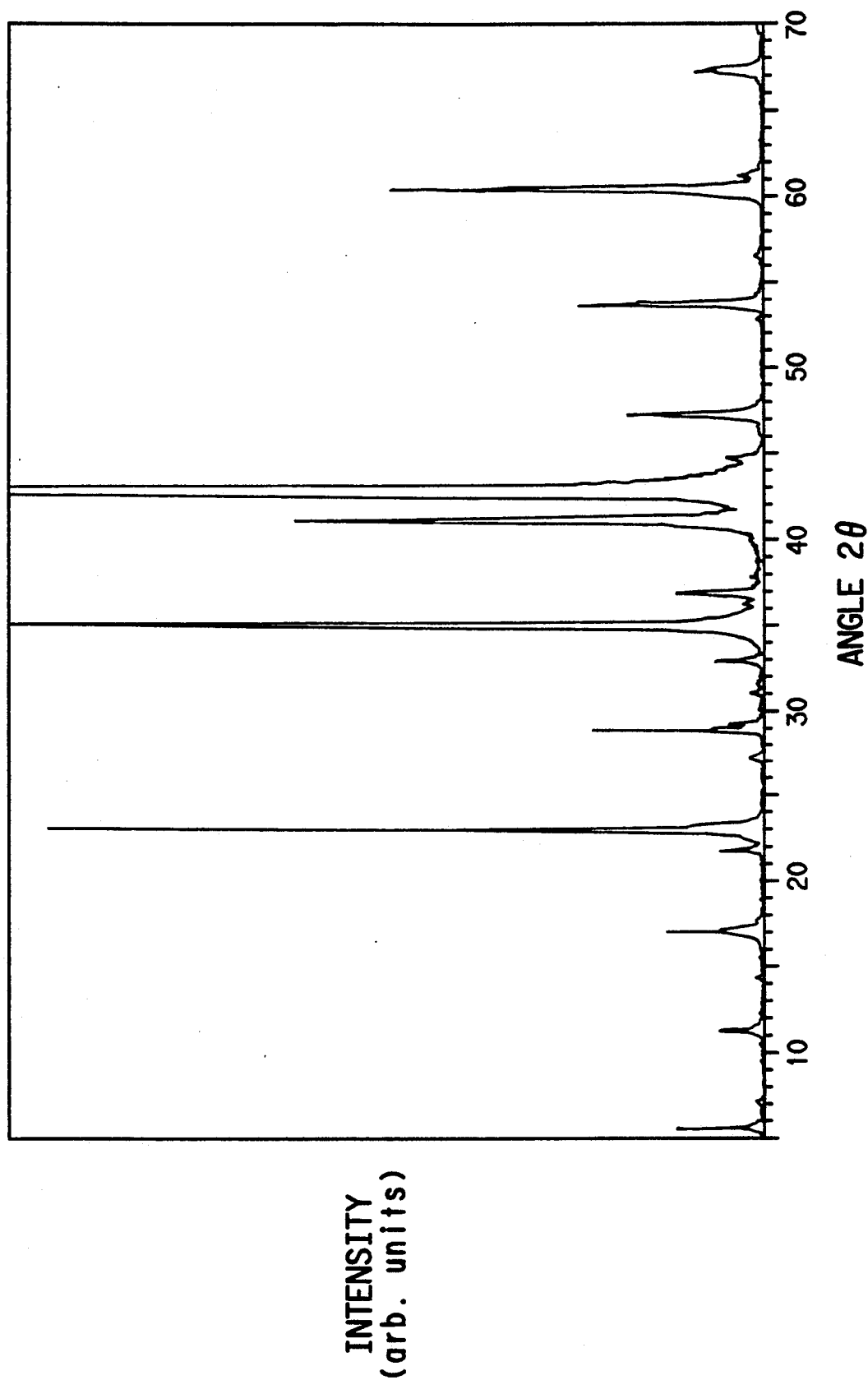
FIG. 4 shows the X-ray diffraction pattern for the film of Example 11.

The MgO substrate bearing the deposited film is removed from the vacuum chamber and sealed in a gold tube that contains 100 mg of $Pb_{0.5}Tl_{0.5}Sr_2Ca_2Cu_3O_9$ superconductor. The tube is heated at 880° C. for four hours. Heating is followed by a 12 hour anneal at 720° C. and cooled to room temperature at 10° C./min. The X-ray diffraction spectra of the film is shown in FIG. 4. The most noticeable feature of FIG. 4 is the set of reflections corresponding to the lattice spacing of 15.2 Å (1.52 nm) of its $PbO.5Tl0.5Sr_2Ca_2Cu_3O_9$ phase. The intensity and width of the lines indicate that the film is highly textured with respect to the crystallographic c-axis. The lines corresponding to the lower critical temperature phase of $(Tl_{0.5}Pb_{0.5})Sr_2CaICu_2O_7$, that has a $T_c$ of about 80° K. and a lattice spacing of 12.1 Å (1.21 nm), are weakly observable in the spectra shown in FIG. 4.

Figure 5:
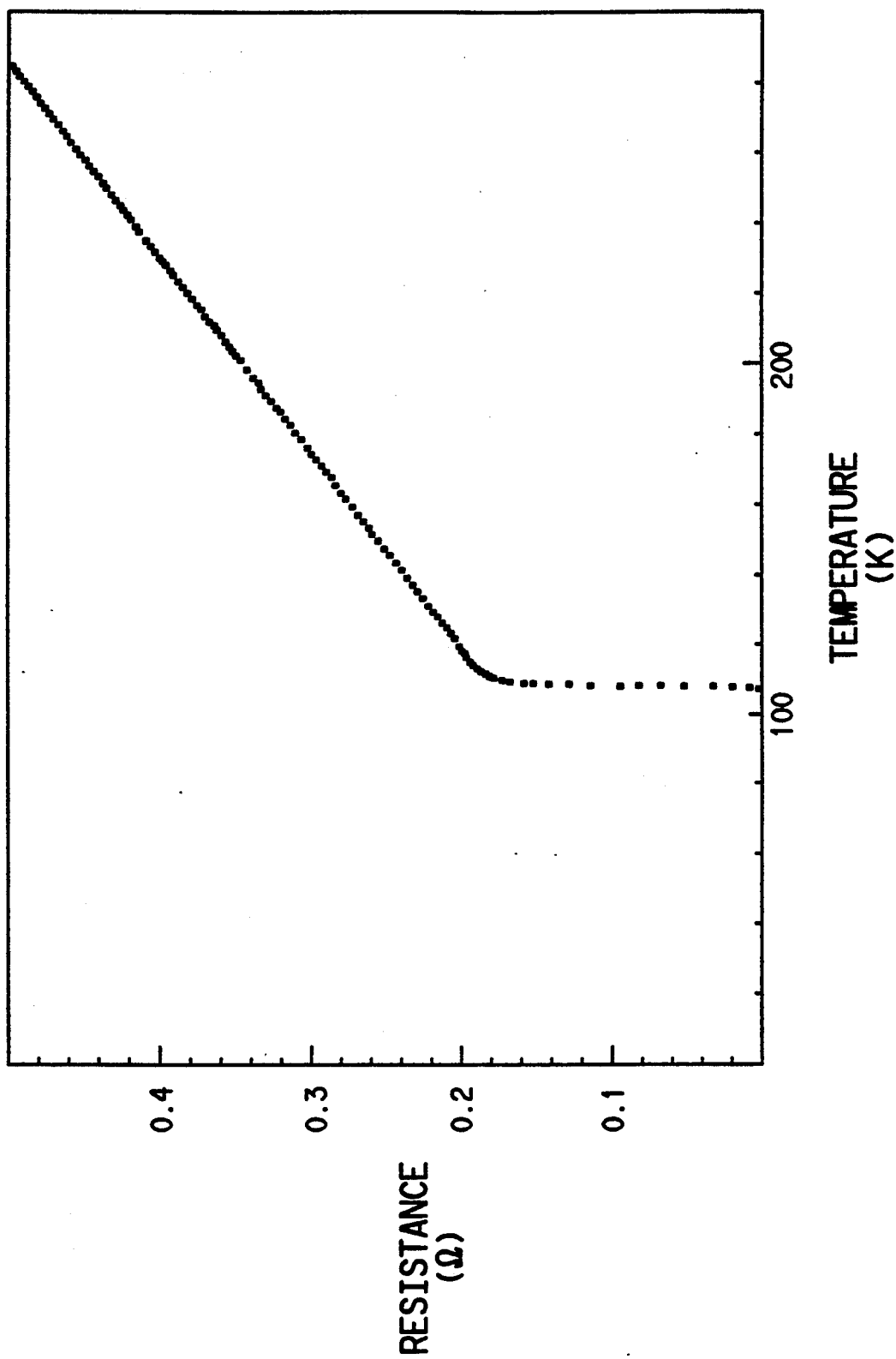
FIG. 5 shows electrical resistance as a function of temperature for the film of Example 11.

FIG. 5 shows resistance versus temperature measurements for the film. These measurements are made using the standard 4-probe method. FIG. 5 shows that the film has an onset of superconductivity at 120° K., zero resistance at 110.5° K. and a transition width $DT = 2(T_{\frac{1}{2}} - T_{R=0}) = 2°$ K., where $T_{\frac{1}{2}}$ is the temperature of the midpoint of the transition and $T_{R=0}$ is $T_c$, the temperature at which the resistance goes to zero.

EXAMPLE 12

The thin oxide film is deposited by ablating a bulk-nonsuperconducting target of $Pb_{0.5}Sr_2Ca_2Cu_3O_x$ with subsequent diffusion of thallium at elevated temperatures. The ablation target is prepared as described in Example 11. Ablation is performed in a chamber similar to the chamber described in Example 11 except that the chamber used in this Example is equipped with quartz windows to permit the laser beam to impact the sample at a 45° angle. The target is ablated with the 248 nm line of a KrF excimer laser (Lambda-Physic EMG-203). The beam is directed into the chamber by plane mirrors and focussed onto a 2×4 mm² spot size by a lens placed at the entrance of the vacuum chamber. Uniform coverage of the substrate is assured by rastering the laser beam onto the target with a set of motorized micrometers placed on the last plane mirror. The fluence of the laser beam is approximately 2.5 J/cm² delivered in a 40 nanosecond pulse. The thin film is deposited on polished $LaAlO_3$ substrate. The substrate temperature during deposition is 550° C. and the deposition time is 30 minutes. The oxygen pressure is maintained at 50 mtorr (6.5 Pa) during deposition. Following deposition, oxygen is bled into the chamber while maintaining the temperature at 550° C. When atmospheric pressure is reached, the sample is cooled to room temperature, about 20° C. The thickness of the film is 1 μm.

Figure 6:
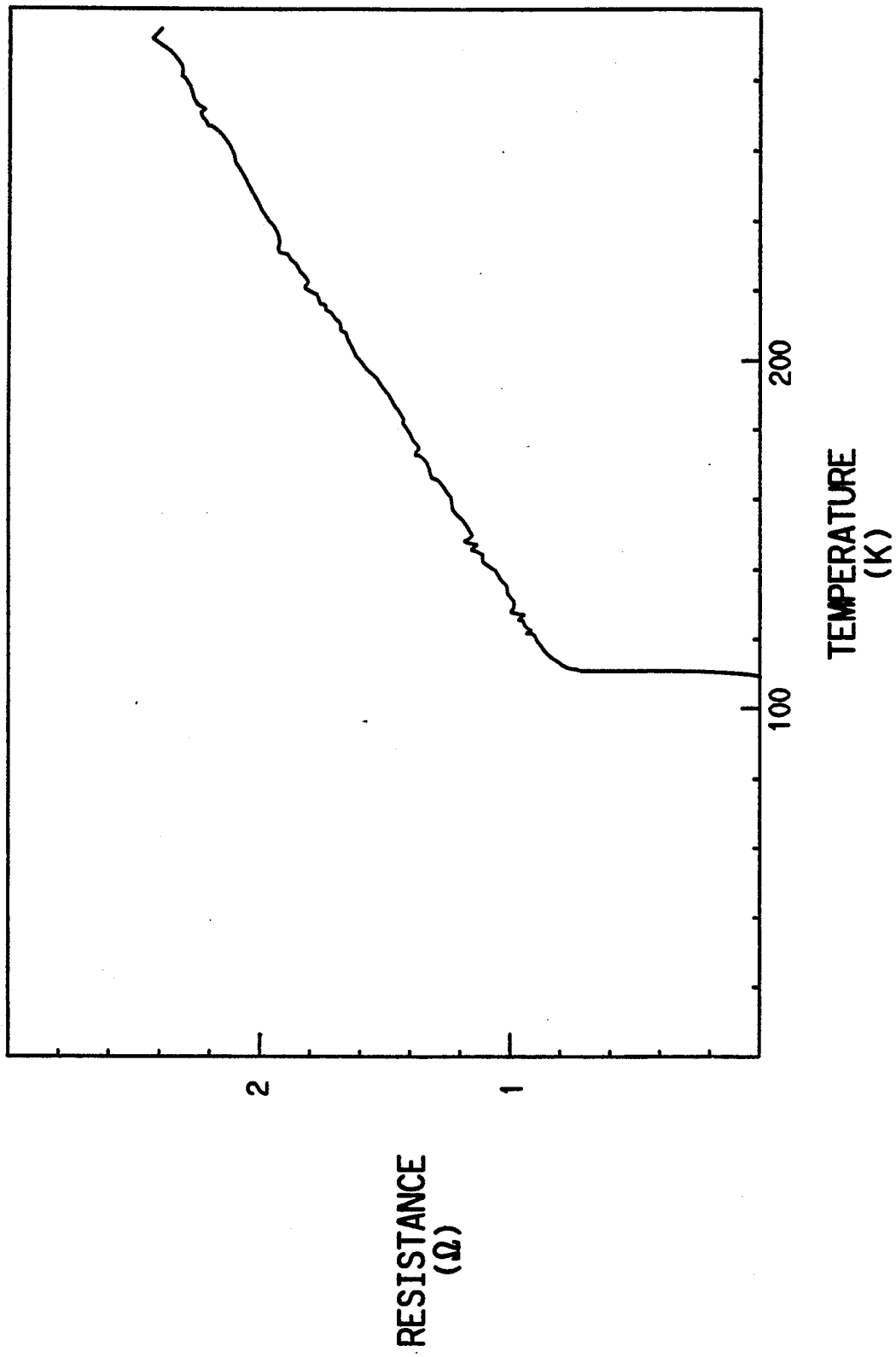
FIG. 6 shows electrical resistance as a function of temperature for the film of Example 12.
Figure 7:
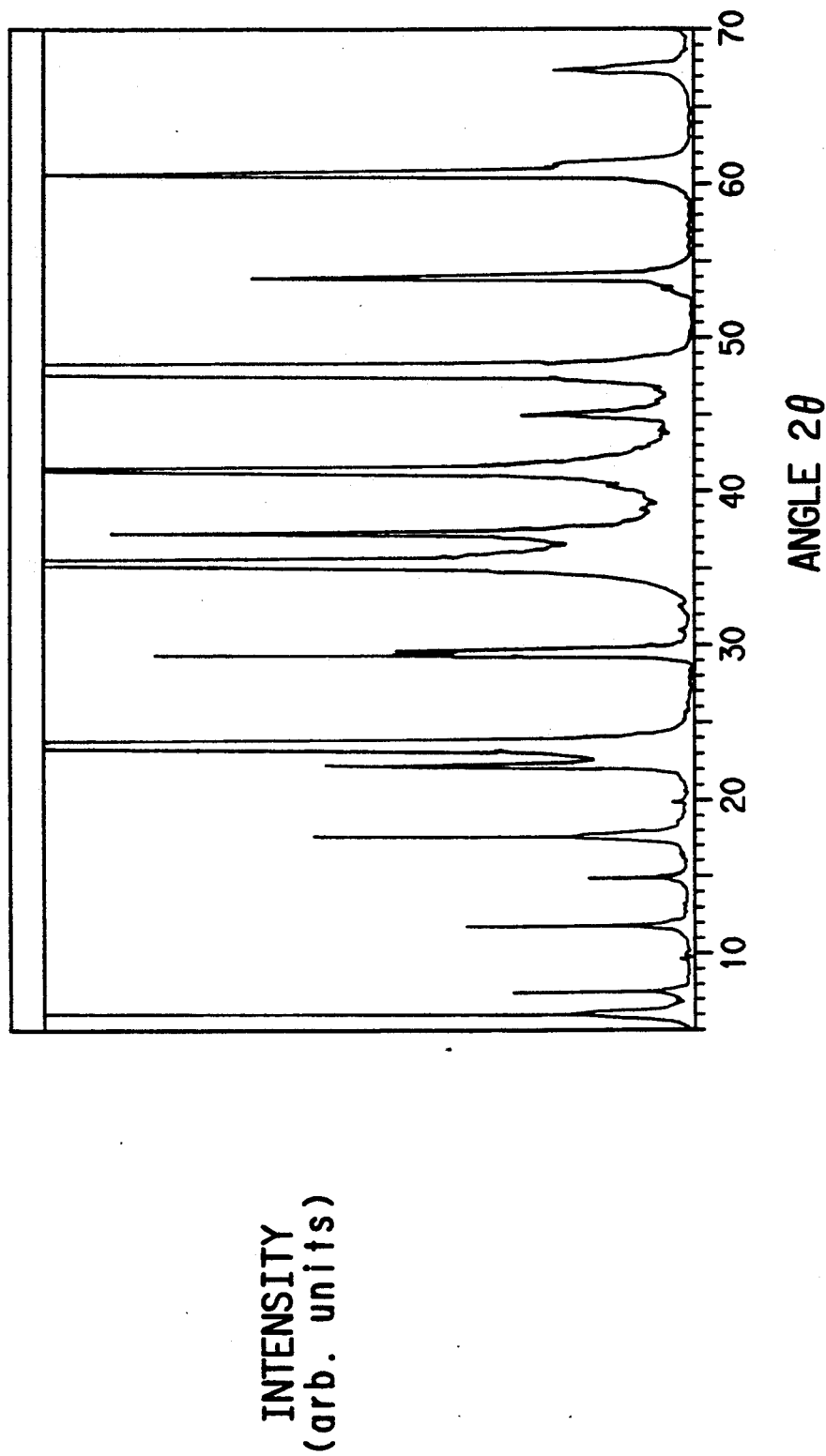
FIG. 7 shows the X-ray diffraction pattern for the film of Example 12.

The substrate bearing the film is removed from the vacuum chamber and sealed in a gold tube containing 100 mg of $Pb_{0.5}Tl_{0.5}Sr_2Ca_2Cu_3O_9$, and heated at 880° C. for 4 hours. The film in the tube is cooled to 720° C. over 2 hours, annealed at 720° C. for 12 hours, and cooled to room temperature, about 20° C., at 10° C./min. FIG. 6 shows the resistance versus temperature curve and a superconductivity transition with zero resistance at 109° K. The X-ray diffraction data of this sample are shown in FIG. 7. The data show a highly textured film consisting mainly of the $Pb_{0.5}Tl_{0.5}Sr_2Ca_2Cu_3O_9$ phase.

EXAMPLES 13-20

A set of 8 thin films is deposited by ablating a bulk-nonsuperconducting target of $Pb_{0.5}Sr_2Ca_2Cu3O_x$ with subsequent thallination at various elevated temperatures. The ablation targets are prepared as described in Example 11. Deposition is performed in the same chamber used in Example 12 and in an essentially identical fashion. The substrates are polished $LaAlO_3$.

Each deposited film is sealed in a gold tube that contains 100 mg of $Pb_{0.5}Tl_{0.5}Sr_2Ca_2Cu_3O_9$ bulk superconductor. The tube is placed into a furnace preheated to the temperature indicated in Table 3. This temperature is maintained for 4 hours. The temperature is lowered to 720° C. over 2 hours, and held at 720° C. for 4 hours before slowly cooling to ambient temperature, about 20° C. X-ray diffraction data and resistance data are collected for each film. The transition temperatures $T_c$ and the ratio of the amount of the desired $(Pb_{0.5}Tl_{0.5})Sr_2Ca_2Cu_3O_9$, i.e., the 1223 phase, to the amount of $(Tl_{0.5}Pb_{0.5})Sr_2CaICu_2O_7$, i.e., the 1212 phase, as measured by the ratio of the intensities of the (006) X-ray reflections for the two phases, are presented in Table 3. These results show that thallination temperatures of from 860° C. to 910° C. result in a predominance of $Pb_{0.5}Tl_{0.5}Sr_2Ca_2Cu_3O_9$.

TABLE 3

| Example No. | Temp (°C.) | $T_c$(K) | Int 1223/ Int 1212 |
| --- | --- | --- | --- |
| 13 | 820 | 0 | 0.60 |
| 14 | 835 | 106.5 | 0.00 |
| 15 | 850 | 62.4 | 1.00 |
| 16 | 865 | 109 | 3.70 |
| 17 | 880 | 104 | 4.00 |
| 18 | 895 | 117 | 6.33 |
| 19 | 910 | 109.7 | 1.94 |
| 20 | 925 | 78.2 | 0.21 |

Other embodiments of the invention will be apparent to those skilled in the art from consideration of the specification, or from practice of the invention disclosed herein. It is intended that the specification and examples be considered as exemplary only, with the scope and spirit of the invention being indicated by the following claims.

What is claimed is:

1. A process for making a superconducting film comprised of $(Tl_{0.5}Pb_{0.5})Sr_2CaCu_2O_7$, $(Tl_{0.5}Pb_{0.5})Sr_2Ca_2Cu_3O_9$ or a mixture thereof, said process comprising:

(a) forming on a substrate an oxide film comprised of Pb, Sr, Ca and Cu with the atomic ratio of Pb:Sr:Ca:Cu of a:m:n:p wherein a is about 0.5, m=2, n is about 2 and p is from about 3 to about 3.5, (b) placing said substrate on which said oxide film has been formed into a container of nonreactive metal that contains a $(Tl_{0.5}Pb_{0.5})Sr_2Ca_2Cu_3O_9$ superconductor, and then sealing said container, (c) heating said sealed container to a temperature of about 820° C. to about 950° C. and maintaining said temperature for at least 1 minute, (d) reducing the temperature to about 600° C. to about 750° C. over a period of about 15 minutes to about 12 hours and maintaining said temperature for 1 to 24 hours, and (e) reducing the temperature to ambient temperature over a period of about 2 to 18 hours and yielding said superconducting film on said substrate.

2. The process of claim 1 wherein said temperature of step (c) is from about 860° C. to about 910° C. and said temperature is maintained for about 2 to about 12 hours.

3. The process of claim 1 wherein said oxide film is prepared by laser ablation using a target of a solid pellet with said atomic ratio of Pb:Sr:Ca:Cu of a:m:n:p.

4. The process of claim 3 wherein said temperature of step (c) is from about 865° C. to about 915° C. and said temperature is maintained for about 2 to about 12 hours.

5. The process of claim 3 wherein said substrate is maintained at a temperature of from about 20° C. to about 600° C. during deposition of said oxide film in an atmosphere of oxygen with a pressure of about 10-200 mtorr (1.3-26 Pa).

6. The process of claim 5 wherein said substrate is maintained at a temperature of from about 450° C. to about 600° C. during said deposition.

7. The process of claim 6 wherein said temperature of step (c) is from about 860° C. to about 910° C. and said temperature is maintained for about 2 to about 12 hours.

8. The process of claim 3 wherein said substrate is either polished MgO or polished $LaAlO_3$.

9. The process of claim 1 wherein said oxide film is formed by spraying an aerosol formed from a solution of nitrates of Pb, Sr, Ca and Cu with said atomic ratio of Pb:Sr:Ca:Cu of a:m:n:p onto the substrate and pyrolizing the nitrates to an oxide.

10. The process of claim 9 wherein said solution is aqueous, said substrate is heated to from about 20° C to about 180° C. during said spraying to form a nitrate film, and said pyrolizing of said nitrate film is accomplished by heating the nitrate film to about 550° C. to about 900° C. in an argon atmosphere.

11. The process of claim 1 wherein said oxide film is formed by depositing a plurality of said nitrate films having said atomic ratio of Pb:Sr:Ca:Cu of a:m:n:p onto the substrate with intermediate heating to pyrolize each said nitrate film to an oxide.

12. The process of claim 1 wherein said oxide film formed in step (a) is heated to a temperature of from about 700° C. to about 900° C. in flowing oxygen and said temperature is maintained for from about 5 to about 15 minutes prior to said heating in said sealed container.

13. The process of claim 9 wherein said temperature of step (c) is from about 860° C. to about 910° C. and said temperature is maintained for about 2 to about 12 hours.

14. The process of claim 11 wherein said temperature of step (c) is from about 860° C. to about 910° C. and said temperature is maintained for about 2 to about 12 hours.

* * * * *